(12) United States Patent
Noda

(10) Patent No.: US 11,699,692 B2
(45) Date of Patent: Jul. 11, 2023

(54) SEMICONDUCTOR DEVICE AND METHOD FOR MANUFACTURING SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takamitsu Noda, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 205 days.

(21) Appl. No.: 17/343,696

(22) Filed: Jun. 9, 2021

(65) Prior Publication Data

US 2021/0398962 A1 Dec. 23, 2021

(30) Foreign Application Priority Data

Jun. 23, 2020 (JP) ................................. 2020-107652

(51) Int. Cl.
*H01L 25/16* (2023.01)
*H01L 23/495* (2006.01)
(Continued)

(52) U.S. Cl.
CPC ........ *H01L 25/167* (2013.01); *H01L 21/4842* (2013.01); *H01L 21/565* (2013.01);
(Continued)

(58) Field of Classification Search
CPC . H01L 25/167; H01L 21/4842; H01L 21/565; H01L 23/3135; H01L 23/49541;
(Continued)

(56) References Cited

U.S. PATENT DOCUMENTS

2022/0140215 A1* 5/2022 Zitzlsperger .......... H01L 23/495
257/79
2022/0337029 A1* 10/2022 Yamamoto .............. H01S 5/026

FOREIGN PATENT DOCUMENTS

JP H05-102762 A 4/1993
JP 4801339 B2 10/2011
(Continued)

*Primary Examiner* — Marc Anthony Armand
(74) *Attorney, Agent, or Firm* — Kim & Stewart LLP

(57) ABSTRACT

A semiconductor device includes a first switching element, a second switching element, an optical coupling element, a plurality of leads and an outer resin member. The first switching element includes a first semiconductor chip and a first inner resin member sealing the first semiconductor chip. The second switching element includes a second semiconductor chip and a second inner resin member sealing the second semiconductor chip. The optical coupling element includes a light-emitting element, a light-receiving element and a third inner resin member sealing the light-emitting element and the light-receiving element. The first and second switching element and the optical coupling element are provided with terminals projecting from the first to third inner resin member, and the plurality of leads are electrically connected to the terminals. The outer resin member seals the first and second switching elements, the optical coupling element, and the plurality of leads.

15 Claims, 9 Drawing Sheets

(51) Int. Cl.
*H01L 23/31* (2006.01)
*H01L 21/48* (2006.01)
*H01L 21/56* (2006.01)
*H01L 23/00* (2006.01)

(52) U.S. Cl.
CPC .... *H01L 23/3135* (2013.01); *H01L 23/49541* (2013.01); *H01L 23/49575* (2013.01); *H01L 24/40* (2013.01); *H01L 24/48* (2013.01); *H01L 2224/40245* (2013.01); *H01L 2224/48245* (2013.01)

(58) Field of Classification Search
CPC ... H01L 23/49575; H01L 24/40; H01L 24/48; H01L 24/32
See application file for complete search history.

(56) References Cited

FOREIGN PATENT DOCUMENTS

| | | |
|---|---|---|
| JP | 5078411 B2 | 11/2012 |
| JP | 2016-219823 A | 12/2016 |
| JP | 2017-033961 A | 2/2017 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2020-107652, filed on Jun. 23, 2020; the entire contents of which are incorporated herein by reference.

FIELD

Embodiments relate to a semiconductor device and a method for manufacturing the same.

BACKGROUND

There is a semiconductor device in which multiple switching elements and a photocoupler are housed in one package. It is required for such a semiconductor device to improve the heat dissipation and reduce the manufacturing cost.

DETAILED DESCRIPTION

Figure 1A:
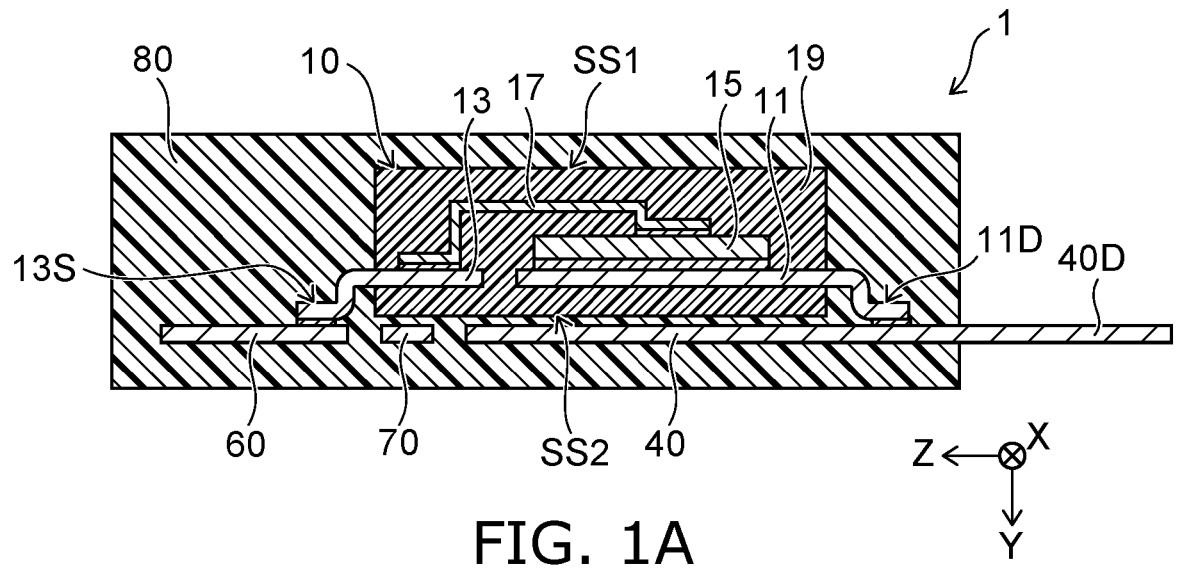
FIGS. 1A and 1B are schematic views showing a semiconductor device according to an embodiment.

According to an embodiment, a semiconductor device includes a first switching element, a second switching element, an optical coupling element, a plurality of leads and an outer resin member. The first switching element includes a first semiconductor chip, a first inner resin member, first and second terminals and a first control terminal. The first semiconductor chip includes a first electrode, a second electrode, and a first control electrode. The first inner resin member seals the first semiconductor chip. The first terminal is electrically connected to the first electrode, the first terminal projecting from the first inner resin member. The second terminal is electrically connected to the second electrode, the second terminal projecting from the first inner resin member. The first control terminal is electrically connected to the first control electrode, the first control terminal projecting from the first inner resin member. The second switching element includes a second semiconductor chip, a second inner resin member, third and fourth terminals and a second control terminal. The second semiconductor chip includes a third electrode, a fourth electrode, and a second control electrode. The second inner resin member seals the second semiconductor chip. The third terminal being electrically connected to the third electrode, and projects from the second inner resin member. The fourth terminal is electrically connected to the fourth electrode, and projects from the second inner resin member. The second control terminal is electrically connected to the second control electrode, and projects from the second inner resin member. The optical coupling element includes a light-emitting element, a light-receiving element, a third inner resin member, an input terminal and first and second output terminals. The light-receiving element is arranged to receive a light emission of the light-emitting element. The third inner resin member seals the light-emitting element and the light-receiving element. The input terminal is electrically connected to the light-emitting element, and projects from the third inner resin member. The first and second output terminals is electrically connected to the light-receiving element, and project from the third inner resin member. The plurality of leads are electrically connected to the first to fourth terminals, the first and second control terminals, the input terminal, and the first and second output terminals. The outer resin member seals the first and second switching elements, the optical coupling element, and the plurality of leads.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
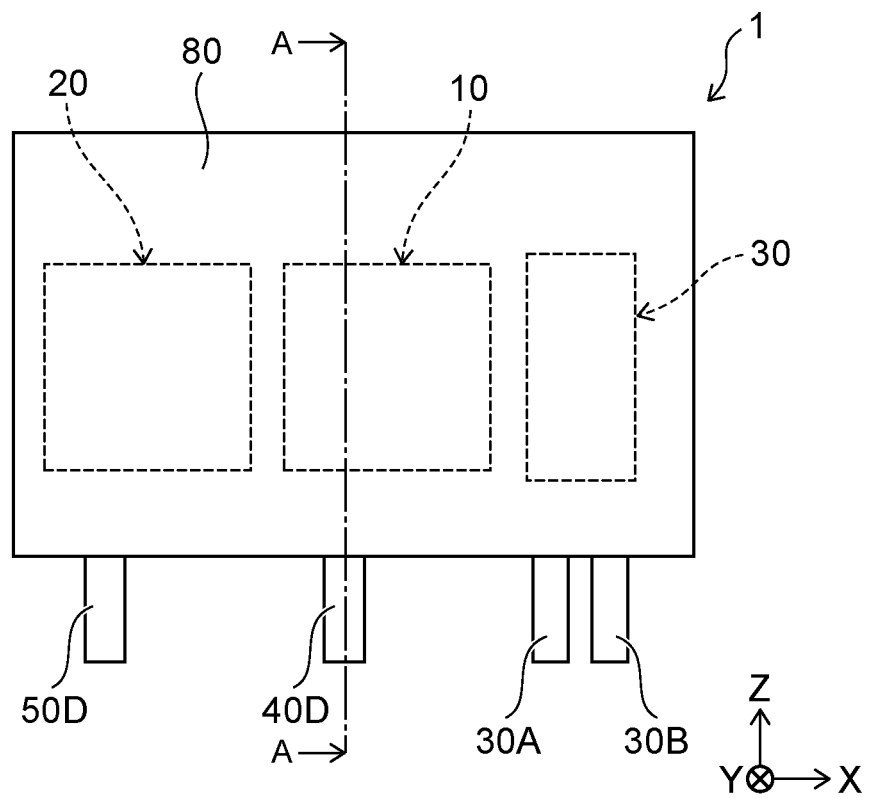

FIGS. 1A and 1B are schematic views showing a semiconductor device 1 according to an embodiment. FIG. 1A is a cross-sectional view along line A-A shown in FIG. 1B. FIG. 1B is a front view of the semiconductor device 1.

As shown in FIGS. 1A and 1B, the semiconductor device 1 includes a first switching element 10, a second switching element 20, and an optical coupling element 30. The semiconductor device 1 is, for example, a photorelay.

As shown in FIG. 1A, the first switching element 10 includes, for example, a lead 11, a lead 13, a semiconductor chip 15, and a connector 17. The semiconductor chip 15 is mounted on the lead 11 and is electrically connected to the lead 13 via the connector 17. The semiconductor chip 15 is, for example, a MOSFET. The leads 11 and 13 and the connector 17 are, for example, metal plates that include copper. For example, each lead may be covered with a metal layer having a stacked structure of nickel (Ni)/palladium (Pd)/gold (Au). This is similar for the other leads described below as well.

For example, the lead 11, the lead 13, the semiconductor chip 15, and the connector 17 are sealed inside a resin member 19. The resin member 19 is, for example, an epoxy resin. The lead 11 includes a terminal 11D projecting from the resin member 19. The lead 13 includes a terminal 13S projecting from the resin member 19. The terminal 11D is, for example, a drain terminal. The terminal 13S is, for example, a source terminal.

The semiconductor device 1 further includes a lead 40, a lead 60, and a control lead 70. For example, the leads 40 and 60 and the control lead 70 are arranged in a Z-direction. The control lead 70 is located between the lead 40 and the lead 60. The leads 40 and 60 and the control lead 70 are, for example, metal plates that include copper. For example, the first switching element 10 is mounted on the leads 40 and 60. The control lead 70 is positioned next to the first switching element 10.

The resin member 19 of the first switching element 10 includes, for example, a front surface SS1, and a back surface SS2 at the side opposite to the front surface SS1. The front surface SS1 and the back surface SS2 cross a Y-direction. The first switching element 10 is mounted so that the back surface SS2 of the resin member 19 faces the lead 40 and the control lead 70.

The terminal 11D of the first switching element 10 projects from the resin member 19 in a direction that is opposite to the Z-direction (hereinbelow, the −Z direction). The terminal 11D is connected to the lead 40. The terminal 13S projects from the resin member 19 in the Z-direction and is connected to the lead 60. For example, the terminal 11D and the terminal 13S are connected respectively to the leads 40 and 60 via solder materials. For example, the resin member 19 isolates the control lead 70 from the first switching element 10.

The first switching element 10, the lead 40, the lead 60, and the control lead 70 are sealed inside a resin member 80. The resin member 80 is, for example, an epoxy resin. For example, the resin member 80 has a composition that is different from that of the resin member 19. The lead 40 includes, for example, an external lead 40D that projects from the resin member 80.

As shown in FIG. 1B, for example, the first switching element 10, the second switching element 20, and the optical coupling element 30 are arranged in an X-direction. The first switching element 10 is located between the second switching element 20 and the optical coupling element 30. The first switching element 10, the second switching element 20, and the optical coupling element 30 are sealed inside the resin member 80. The second switching element 20 has a structure similar to the structure of the first switching element 10 shown in FIG. 1A. The structure of the optical coupling element 30 is described below.

The semiconductor device 1 includes an input lead 30A, an input lead 30B, the external lead 40D, and an external lead 50D that project from the resin member 80. The input lead 30A, the input lead 30B, the external lead 40D, and the external lead 50D project from the resin member 80 in the same direction, e.g., the −Z direction.

Figure 2A:
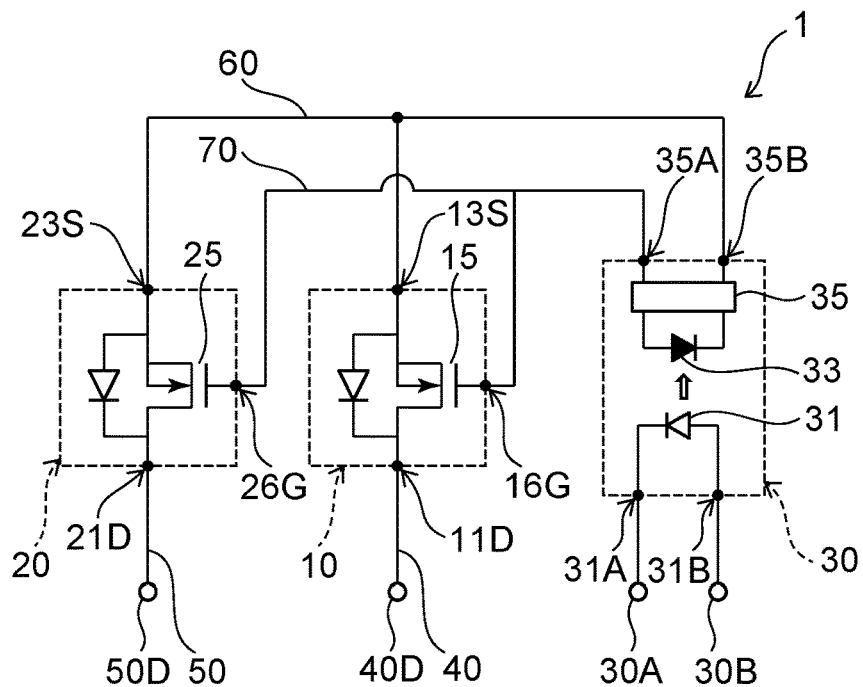
FIGS. 2A and 2B are schematic views showing the configuration of the semiconductor device according to the embodiment.
Figure 2B:
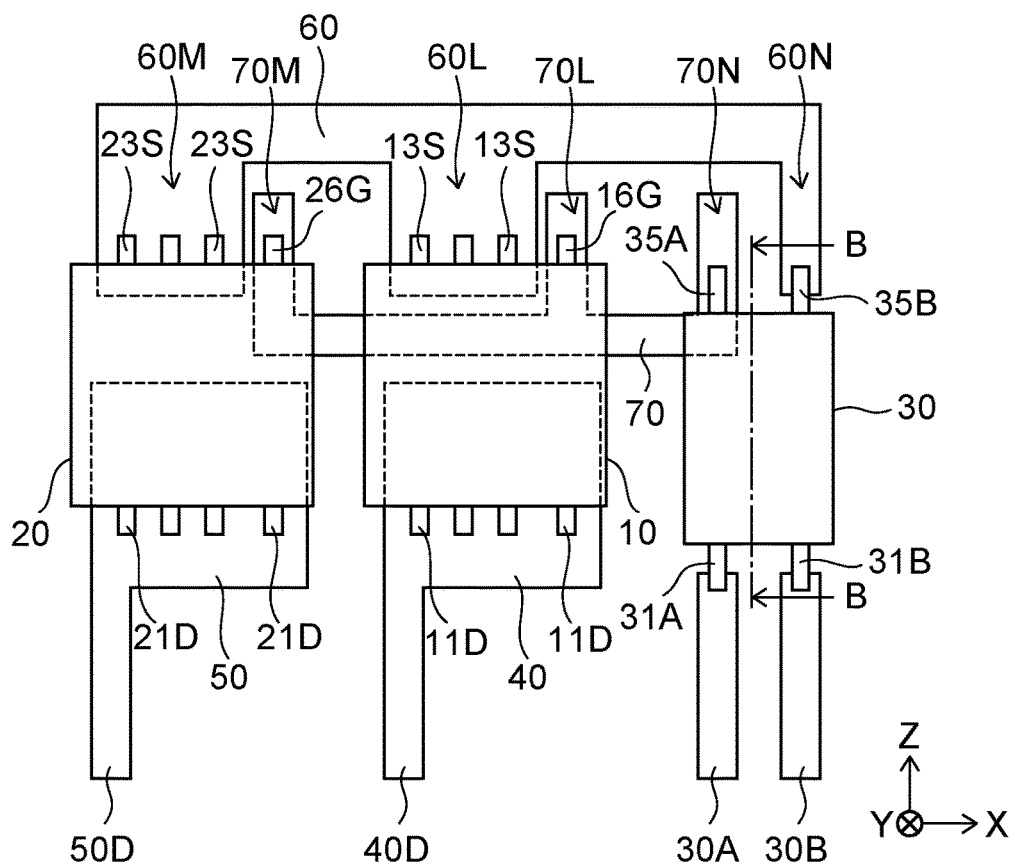

FIGS. 2A and 2B are schematic views showing the configuration of the semiconductor device 1 according to the embodiment. FIG. 2A is a circuit diagram. FIG. 2B is a plan view showing the connection layout of the leads and the terminals.

As shown in FIG. 2A, the first switching element 10 and the second switching element 20 include the semiconductor chip 15 and a semiconductor chip 25, respectively. The semiconductor chips 15 and 25 are, for example, MOSFETs.

The lead 40 is electrically connected to the drain side of the semiconductor chip 15. A lead 50 is electrically connected to the drain side of the semiconductor chip 25. The lead 60 is electrically connected to the source of the semiconductor chip 15 and the source of the semiconductor chip 25.

The control lead 70 is electrically connected to the gate of the semiconductor chip 15 and the gate of the semiconductor chip 25.

The optical coupling element 30 includes, for example, a light-emitting element 31, a light-receiving element 33, and a control circuit 35. The light-emitting element 31 is, for example, a light-emitting diode. The light-receiving element 33 is, for example, a photodiode. The light-receiving element 33 is arranged to receive the light emitted by the light-emitting element 31. The control circuit 35 is electrically connected to the light-receiving element 33 and outputs a signal corresponding to the photocurrent output from the light-receiving element 33.

The input leads 30A and 30B are electrically connected to the light-emitting element 31. The lead 60 and the control lead 70 are electrically connected to the output side of the control circuit 35.

As shown in FIG. 2B, the first switching element 10 is connected to the leads 40 and 60. The second switching element 20 is connected to the leads 50 and 60. The first and second switching elements 10 and 20 are provided with the portions overlapping the control lead 70.

The terminal 11D of the first switching element 10 is connected to the lead 40. The terminal 11D is electrically connected to the drain of the semiconductor chip 15. The lead 40 includes the external lead 40D that projects from the resin member 80.

A terminal 21D of the second switching element 20 is connected to the lead 50. The terminal 21D is electrically connected to the drain of the semiconductor chip 25. The lead 50 includes the external lead 50D that projects from the resin member 80.

The terminal 13S of the first switching element 10 and a terminal 23S of the second switching element 20 are connected to the lead 60. The terminal 13S is electrically connected to the source of the semiconductor chip 15. The terminal 23S is electrically connected to the source of the semiconductor chip 25.

A control terminal 16G of the first switching element 10 and a control terminal 26G of the second switching element 20 are connected to the control lead 70. The control terminal 16G is electrically connected to the gate of the semiconductor chip 15. The control terminal 26G is electrically connected to the gate of the semiconductor chip 25. In other words, the control lead 70 electrically connects the gate of the semiconductor chip 15 and the gate of the semiconductor chip 25.

The optical coupling element 30 includes, for example, input terminals 31A and 31B and output terminals 35A and 35B. The input terminals 31A and 31B are electrically connected to the light-emitting element 31. The output terminals 35A and 35B are electrically connected to the control circuit 35.

The input terminal 31A is connected to the input lead 30A; and the input terminal 31B is connected to the input lead 30B. For example, the output terminal 35A is connected to the control lead 70. For example, the output terminal 35B is connected to the lead 60.

The lead 60 includes bonding portions 60L, 60M, and 60N. For example, the bonding portions 60L, 60M, and 60N extend in the −Z direction from the major portion of the lead 60 that extends in the X-direction. The first switching element 10 has at least one terminal 13S connected to the bonding portion 60L. The second switching element 20 has at least one terminal 23S connected to the bonding portion 60M. The output terminal 35B of the optical coupling element 30 is connected to the bonding portion 60N.

The control lead 70 includes bonding portions 70L, 70M, and 70N. For example, the bonding portions 70L, 70M, and 70N extend in a direction (the Z-direction) toward the lead 60 from the major portion of the control lead 70 extending in the X-direction. The control terminal 16G of the first switching element is connected to the bonding portion 70L; and the control terminal 26G of the second switching element 20 is connected to the bonding portion 70M. The output terminal 35A of the optical coupling element 30 is connected to the bonding portion 70N.

In the semiconductor device 1, the signal that is input to the input leads 30A and 30B is transmitted via the light-emitting element 31 and the light-receiving element 33. The signal is output from the control circuit 35. In the semiconductor chips 15 and 25, the on-off control is performed by applying the output of the control circuit 35 between the gate and source of the semiconductor chips 15 and 25. For example, when the semiconductor chips 15 and 25 are simultaneously turned on, electrical conduction via the lead 60 is provided between the external lead 40D and the external lead 50D. On the other hand, when the semiconductor chips 15 and 25 are turned off, the external lead 40D and the external lead 50D are in an open state.

Figure 3A:
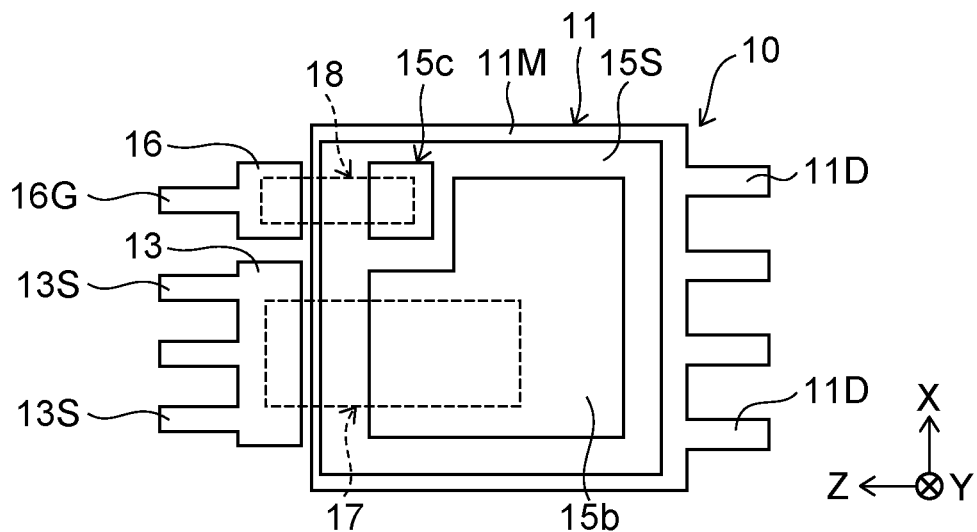
FIGS. 3A to 3C are schematic views illustrating the switching element and the optical coupling element according to the embodiment.
Figure 3B:
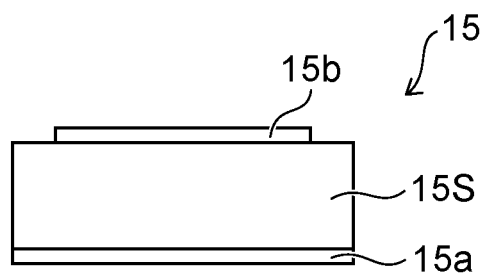
Figure 3C:
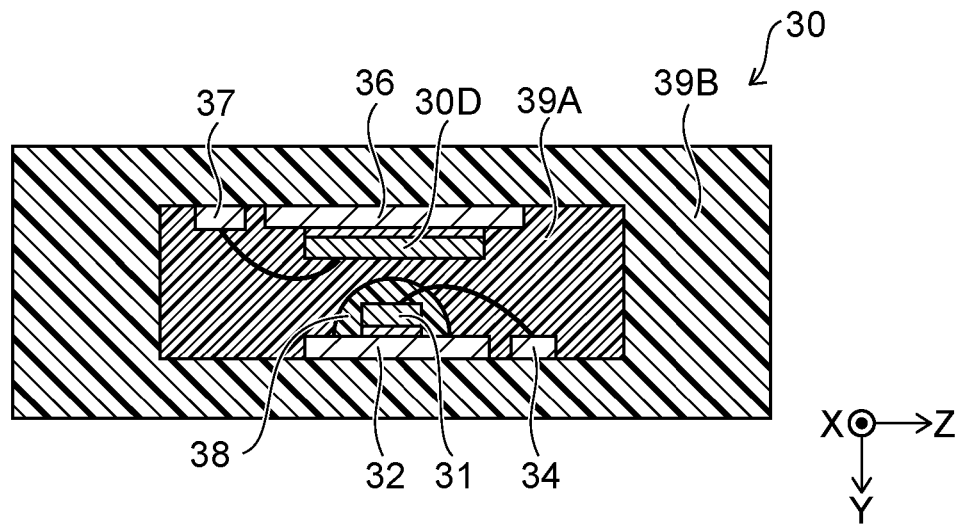

FIGS. 3A to 3C are schematic views illustrating the switching element 10 and the optical coupling element 30 according to the embodiment. FIG. 3A is a plan view showing the arrangement of the semiconductor chip 15, the lead 13, and a control lead 16. FIG. 3B is a front view of the semiconductor chip 15. FIG. 3C is a cross-sectional view of the optical coupling element 30 along line B-B shown in FIG. 2B.

As shown in FIGS. 3A and 3B, the semiconductor chip 15 includes a semiconductor part 15S, a drain electrode 15a, a source electrode 15b, and a gate electrode 15c. The drain electrode 15a is provided at the backside of the semiconductor part 15S. The source electrode 15b and the gate electrode 15c are provided at the front side of the semiconductor part 15S and are apart from each other.

For example, the semiconductor chip 15 is mounted so that the drain electrode 15a faces the lead 11 via a solder material (referring to FIG. 1A). The lead 11 includes a mount base 11M on which the semiconductor chip 15 is mounted, and is provided with at least one terminal 11D projecting from the mount base 11M.

The lead 13 is electrically connected to the source electrode 15b of the semiconductor chip 15 via the connector 17. For example, the semiconductor chip 15 may be connected to the lead 13 via a metal wire. The lead 13 includes, for example, at least one terminal 13S projecting in a direction (the Z-direction) opposite to the semiconductor chip 15.

The switching element 10 further includes the control lead 16. For example, the control lead 16 is electrically connected to the gate electrode 15c of the semiconductor chip 15 via a connector 18. The control lead 16 includes, for example, the control terminal 16G that extends in a direction (the Z-direction) opposite to the semiconductor chip 15. The control lead 16 is sealed inside the resin member 19 together with the semiconductor chip 15 and the lead 13 (referring to FIG. 1A). For example, the control terminal 16G projects from the resin member 19 in the same direction as the terminal 13S.

As shown in FIG. 3C, the optical coupling element 30 includes, for example, the light-emitting element 31, a light-receiving chip 30D, a resin member 38, a resin member 39A, and a resin member 39B.

For example, the light-emitting element 31 is mounted on a mount base 32 and is electrically connected to a lead 34 via a metal wire. The mount base 32 is, for example, a metal plate that includes copper. For example, the light-emitting element 31 may be sealed on the mount base 32 by the resin member 38. The resin member 38 is, for example, silicone and is transparent to the light emitted by the light-emitting element 31.

The light-receiving chip 30D includes, for example, the light-receiving element 33 and the control circuit 35. The light-receiving chip 30D is, for example, a silicon chip on which the light-receiving element 33 and the control circuit 35 thereof are integrated. For example, the light-receiving chip 30D is mounted on a mount base 36 and electrically connected to a lead 37 via a metal wire.

For example, the mount bases 32 and 36 are arranged so that the light-emitting surface of the light-emitting element 31 and the light-receiving surface of the light-receiving element 33 face each other. The light-emitting element 31 and the light-receiving chip 30D are sealed with the resin member 39A that is filled between the mount bases 32 and 36. The resin member 39A is, for example, an epoxy resin that includes a filler and is transparent to the light emitted by the light-emitting element 31. In other words, the light-emitting element 31 and the light-receiving element 33 are optically coupled via the resin members 38 and 39A.

The resin member 39B covers, for example, the light-emitting element 31, the light-receiving chip 30D, and the resin member 39A. The resin member 39B includes, for example, a material that is opaque to the light emitted by the light-emitting element 31. The resin member 39B is, for example, an epoxy resin that includes a filler. For example, when thermosetting the resin members 39A and 39B, the shrinkage factors thereof are controlled by the content of the filler. For example, it is preferable for the resin member 39B to control the shrinkage factor thereof to be greater than the shrinkage factor of the resin member 39A.

For example, the mount base 32 and the lead 34 are electrically connected respectively to the input terminals 31A and 31B that project from the resin member 39B. For example, the mount base 36 and the lead 37 are electrically connected respectively to the output terminals 35A and 35B that project from the resin member 39B. The mount bases 32 and 36 and the terminals each are covered with a metal layer that has, for example, a stacked structure of nickel (Ni)/palladium (Pd)/gold (Au).

A method for manufacturing the semiconductor device 1 according to the embodiment will now be described with reference to FIGS. 4A to 5B. FIGS. 4A to 5B are schematic views showing manufacturing processes of the semiconductor device 1 according to the embodiment.

Figure 4A:
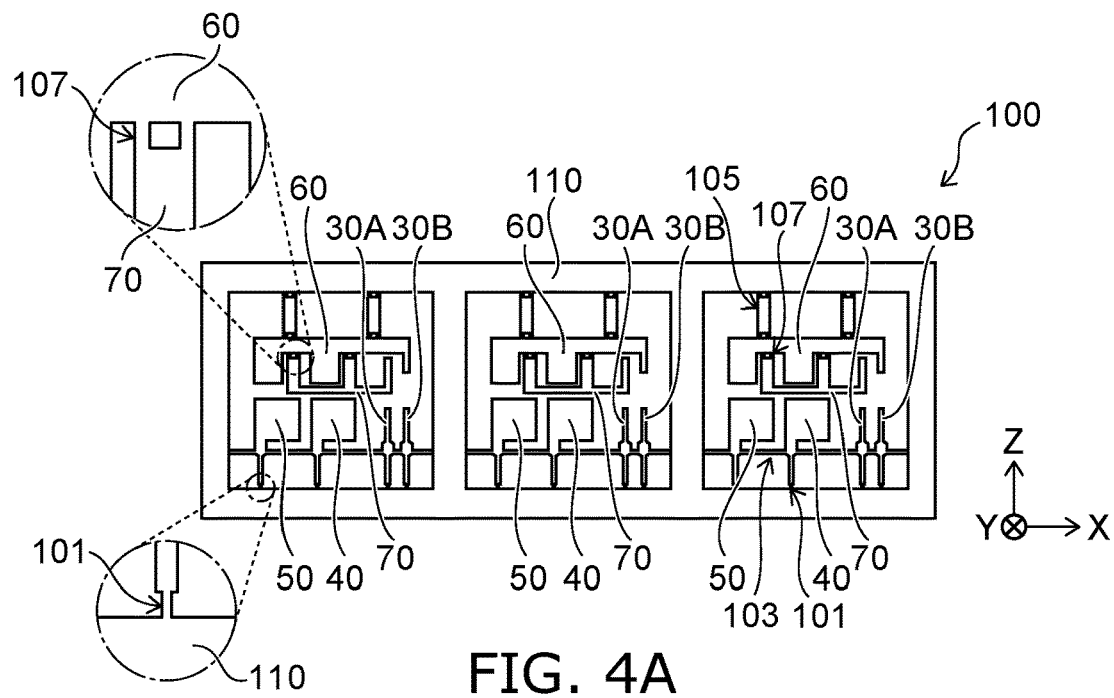
FIGS. 4A to 5B are schematic views showing manufacturing processes of the semiconductor device according to the embodiment.

A leadframe 100 is prepared as shown in FIG. 4A. The leadframe 100 includes, for example, the input leads 30A and 30B, the leads 40, 50, and 60, the control lead 70, and a frame 110. The leadframe 100 is, for example, a metal plate that includes copper.

The input leads 30A and 30B and the leads 40 and 50 are linked to the frame 110 via suspension pins 101. The input leads 30A and 30B and the leads 40 and 50 are also linked to the frame 110 via suspension pins 103 that are provided to extend in the X-direction.

The lead 60 is linked to the frame 110 via, for example, a suspension pin 105. The control lead 70 is linked to the lead 60 via, for example, a suspension pin 107.

Figure 4B:
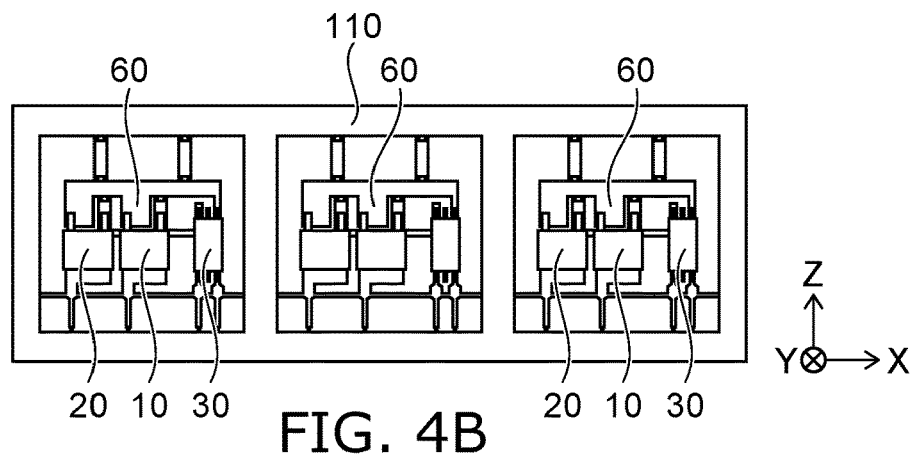

As shown in FIG. 4B, the first switching element 10, the second switching element 20, and the optical coupling element 30 are mounted on the leadframe 100 (referring to FIG. 2B). The first switching element 10 is connected to the lead 40, the lead 60, and the control lead 70. The second switching element 20 is connected to the lead 50, the lead 60, and the control lead 70. The optical coupling element 30 is connected to the input leads 30A and 30B, the lead 60, and the control lead 70.

For example, the first switching element 10, the second switching element 20, and the optical coupling element 30 are temporarily fixed on the leadframe 100 via the solder cream and are subsequently fixed by reflow.

Figure 4C:
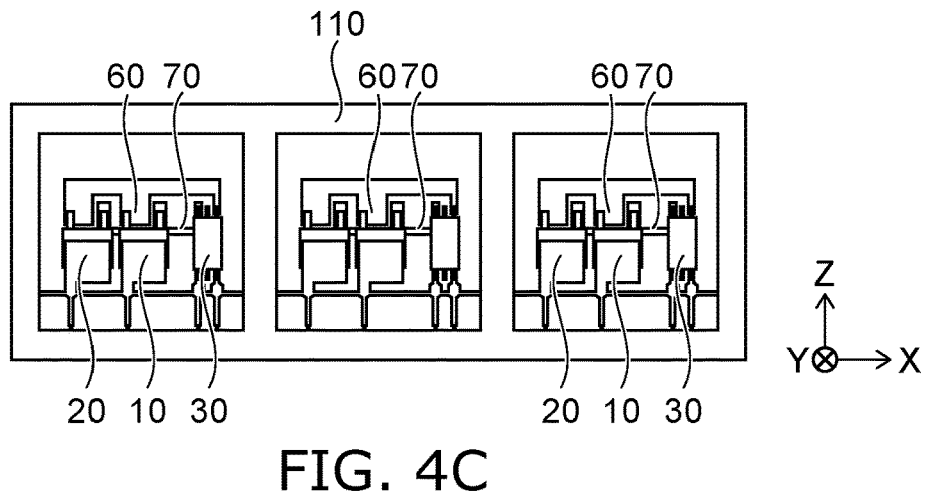

As shown in FIG. 4C, the suspension pin 105 that links the lead 60 and the frame 110 is cut; and the suspension pin 107 that links the lead 60 and the control lead 70 is cut. In other words, the suspension pins 105 and 107 are removed in the region over which the resin member 80 is provided.

Figure 5A:
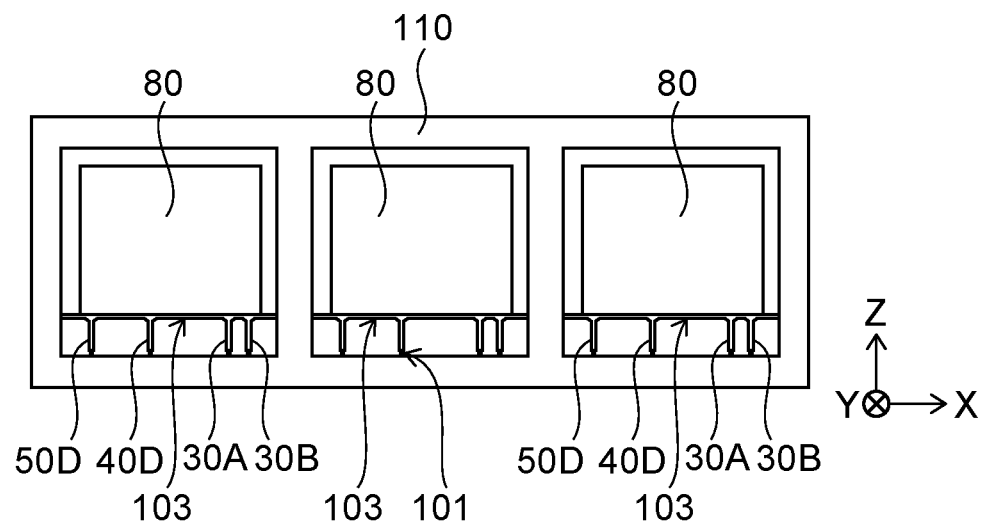

As shown in FIG. 5A, the resin member 80 is provided by resin molding to seal the first switching element 10, the second switching element 20, and the optical coupling element 30. The resin member 80 is molded so that the external leads 40D and 50D and the input leads 30A and 30B project. Also, the resin member 80 is molded so that the suspension pin 103 and the suspension pin 101 are exposed, which link the external leads 40D and 50D and the input leads 30A and 30B to the frame 110.

Figure 5B:
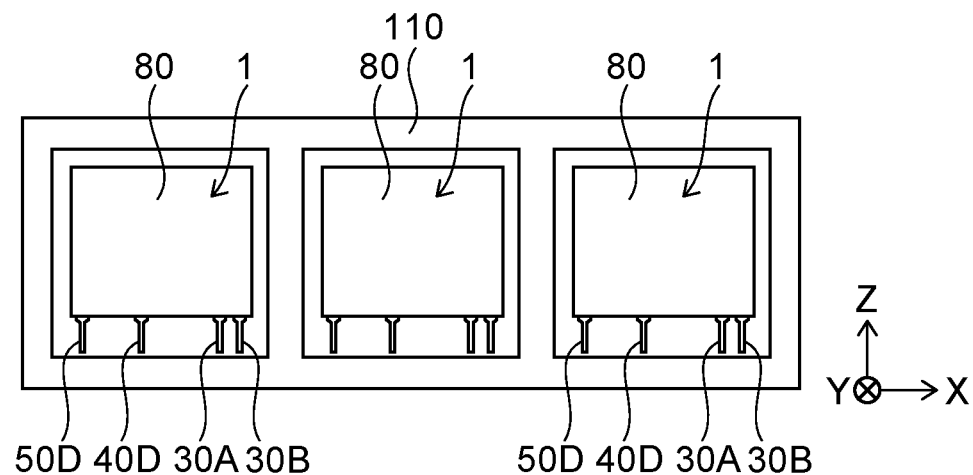

As shown in FIG. 5B, the semiconductor device 1 is separated from the frame 110 by cutting the suspension pins 101 and 103 that link the external leads 40D and 50D and the input leads 30A and 30B to the frame 110.

According to the embodiment, the first switching element 10, the second switching element 20, and the optical coupling element 30 are sealed with resins when mounted to the leadframe 100. For example, it is possible to use commercially available elements that are sealed with resins as the first switching element 10, the second switching element 20, and the optical coupling element 30; thus, the manufacturing processes of the semiconductor device 1 can be shortened; and the manufacturing cost may be reduced.

In the semiconductor device 1, the semiconductor chips 15 and 25 are doubly sealed with a resin (referring to FIG. 1A); and the light-emitting element 31 and the light-receiving chip 30D are triply sealed with a resin (FIG. 3C). Therefore, even if the adhesion degrades between the resin member 80 and the leads that externally project, the airtightness of the elements sealed in the inner resin is maintained (referring to FIGS. 1A and 1B). The semiconductor device 1 can be provided with reliability increased thereby.

The light-emitting element 31 is sealed with the resin member 38, and thus, is quadruply sealed with the resin members. Thereby, the light-emitting element 31 is further prevented from the moisture and/or air penetration from the outside. For example, the optical coupling element 30 has the reliability depending on the life of the light-emitting element 31. Accordingly, the optical coupling element 30 can be provided with the reliability increased by blocking the external air, resulting in the increased life of the light-emitting element 31. Also, the optical coupling element can be provided with the reliability thereof further improved by preventing discoloration and the like of the resin member that affects the efficiency of the optical coupling.

According to the embodiment, the resin members 19 of the first and second switching elements 10 and 20 isolate the control lead 70 from the leads located inside the resin members 19. In other words, it is unnecessary to consider the isolation between the control lead 70 and the leads linked to the semiconductor chips 15 and 25, and thus, the design of the leadframe 100 is easier and may reduce the manufacturing cost.

In the semiconductor device 1, the heat dissipation can be improved by connecting the first switching element 10, the second switching element 20, and the optical coupling element 30 via multiple leads. In other words, it is possible to dissipate the heat of the semiconductor chips 15 and 25 via the leads that have superior thermal conductivity. For example, the heat dissipation may be improved in the semiconductor device 1 comparing to the case where the first switching element 10, the second switching element 20, and the optical coupling element 30 are mounted on a circuit board.

Figure 6A:
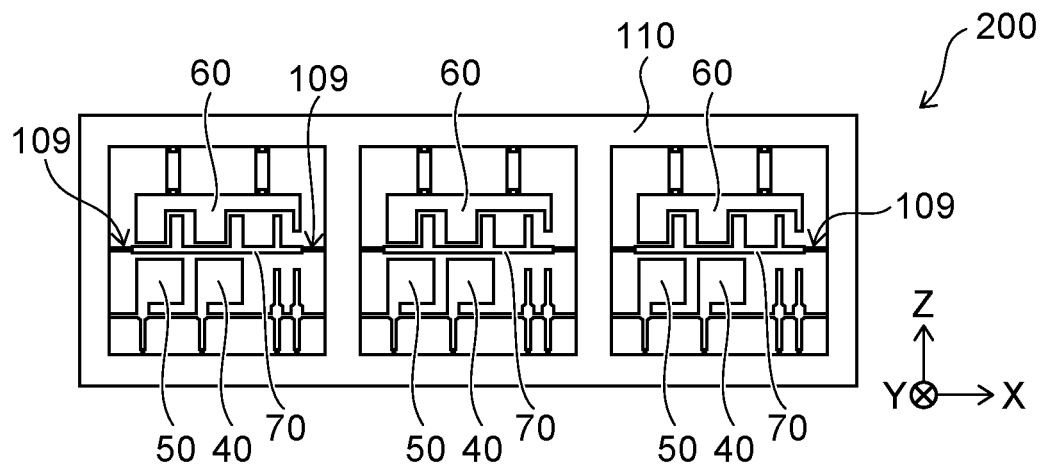
FIGS. 6A and 6B are schematic views showing a semiconductor device according to a modification of the embodiment.
Figure 6B:
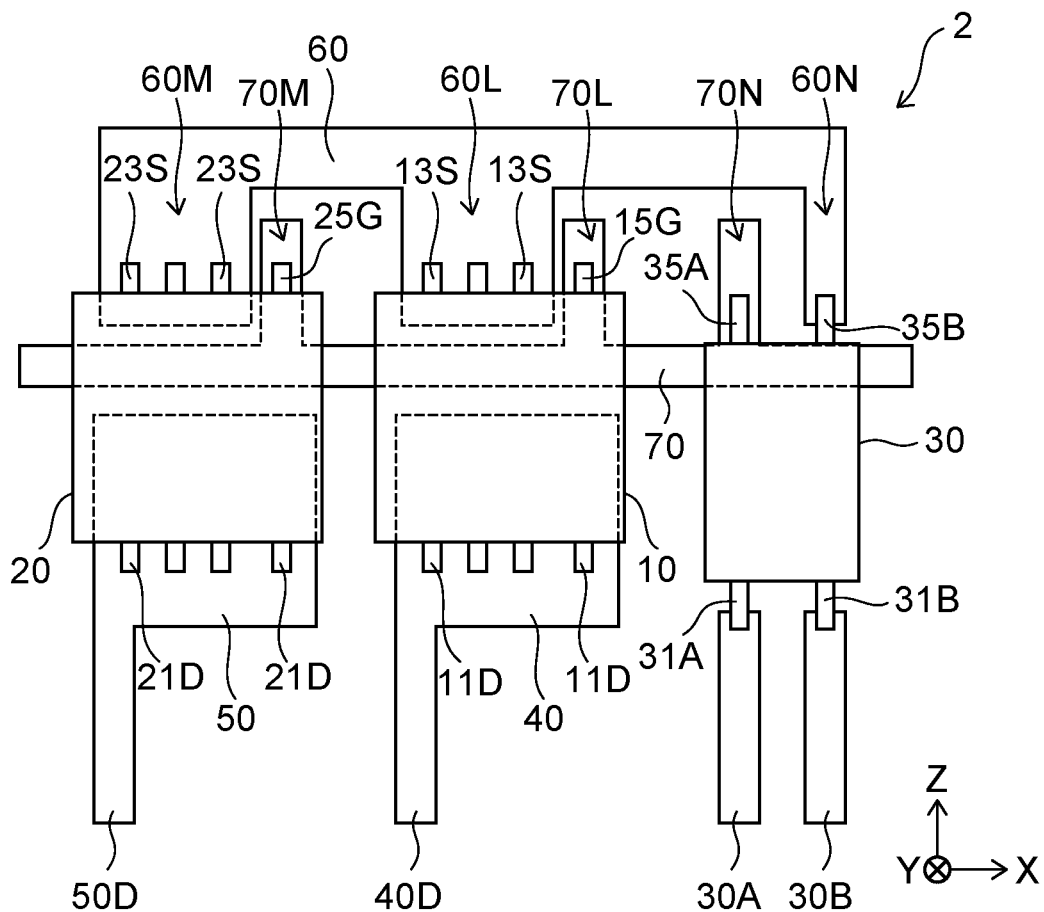

FIGS. 6A and 6B are schematic views showing a semiconductor device 2 according to a modification of the embodiment. FIG. 6A is a plan view showing a leadframe 200. FIG. 6B is a plan view showing the connection layout of the leads and the terminals.

As shown in FIG. 6A, the leadframe 200 also includes the input leads 30A and 30B, the leads 40, 50, and 60, the control lead 70, and the frame 110. In the example, the control lead 70 extends in the X-direction between the lead 40 and the lead 60 and between the lead 50 and the lead 60. the control lead 70 is linked directly to the frame 110 via a suspension pin 109. Therefore, the lead 60 and the control lead 70 can be apart from each other. Therefore, the cutting process of the suspension pin that links the lead 60 and the control lead 70 is unnecessary, and the manufacturing processes can be simplified.

As shown in FIG. 6B, the major portion of the control lead 70 extends below the first switching element 10, the second switching element 20, and the optical coupling element 30. Such a configuration may be advantageous for filling the space between the control lead 70 and each of the lead 40, 50 and 60 with the resin member 80 without forming voids because it is possible to arrange the leads 40, 50 and 60 with sufficiently wide spacing between the lead 40 and the lead 60 and between the lead 50 and the lead 60.

Figure 7A:
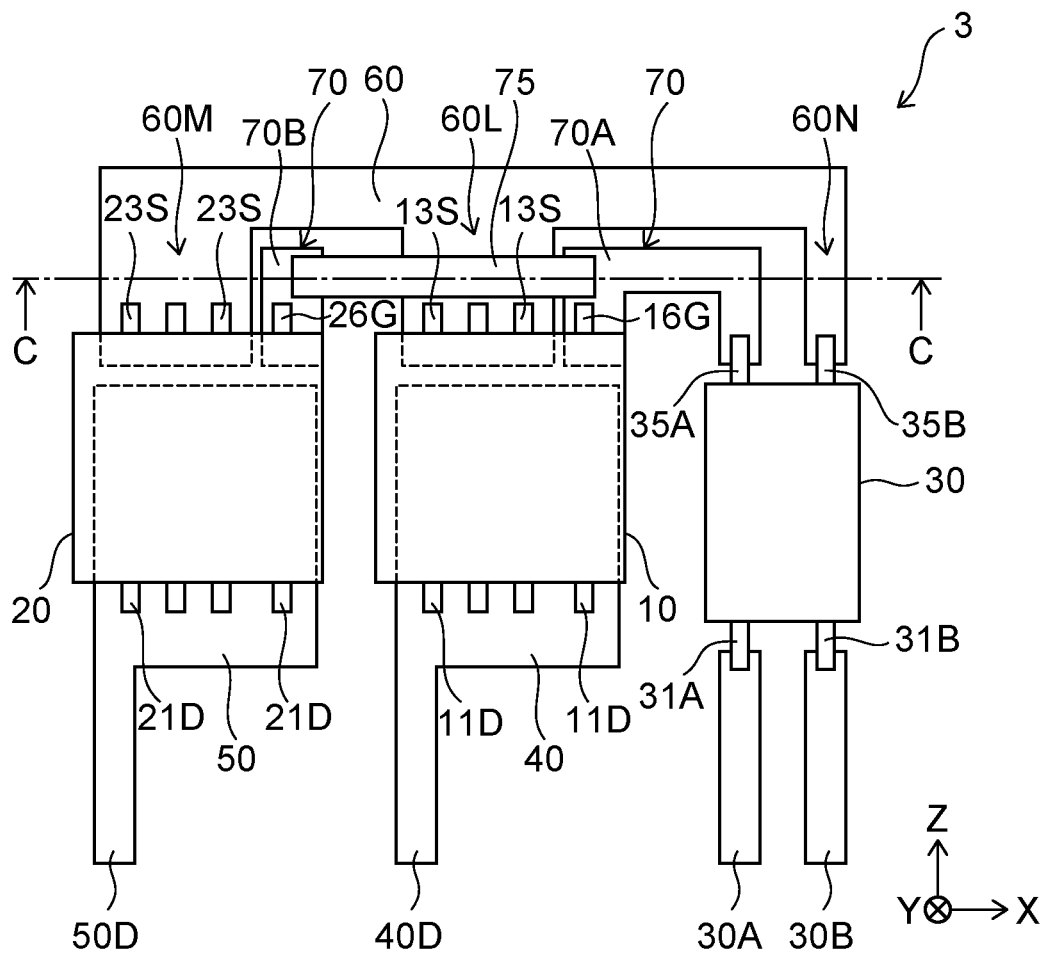
FIGS. 7A and 7B are schematic views showing a semiconductor device according to another modification of the embodiment.
Figure 7B:
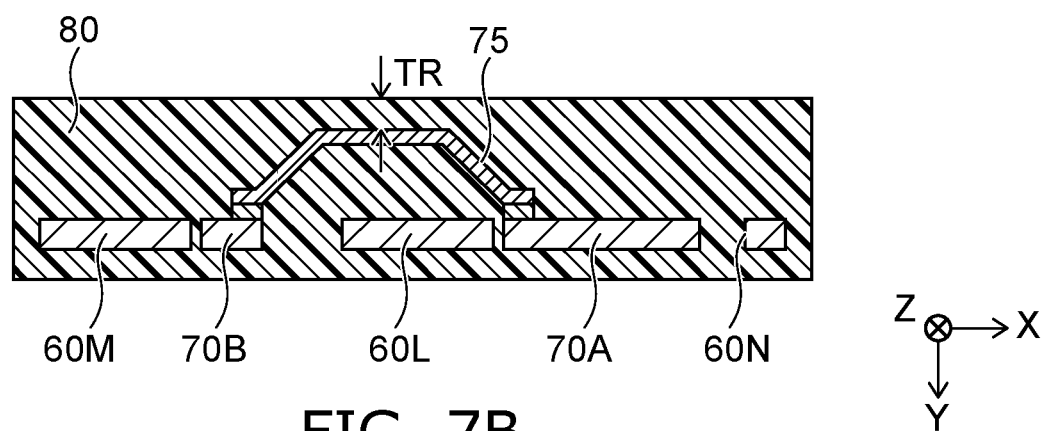

FIGS. 7A and 7B are schematic views showing a semiconductor device 3 according to another modification of the embodiment. FIG. 7A is a plan view showing the connection layout of the leads and the terminals. FIG. 7B is a cross-sectional view along line C-C shown in FIG. 7A.

As shown in FIG. 7A, the control lead 70 includes a first portion 70A and a second portion 70B. The first portion 70A is separated from the second portion 70B. Also, the first portion 70A is provided between the bonding portion 60L and the bonding portion 60N of the lead 60. The second portion 70B is provided between the bonding portion 60L and the bonding portion 60M of the lead 60.

The control terminal 16G of the first switching element 10 is connected to the first portion 70A; and the control terminal 26G of the second switching element 20 is connected to the second portion 70B. The output terminal 35A of the optical coupling element 30 is connected to the first portion 70A of the control lead 70.

As shown in FIGS. 7A and 7B, the first portion 70A and the second portion 70B are electrically connected via a connector 75. The connector 75 straddles the bonding portion 60L of the lead 60 and is connected to the first and second portions 70A and 70B via, for example, solder materials. The connector 75 is, for example, a metal plate that includes copper.

In the example, the control lead 70 is provided without a portion positioned between the lead 40 and the bonding portion 60L and a portion positioned between the lead 50 and the bonding portion 60M. Therefore, it is possible to widen the surface area of the lead 40 extending under the first switching element 10 and the surface area of the lead 50 extending under the second switching element 20. Thus, the heat dissipations of the first switching element 10 via the lead 40 and the second switching element 20 via the lead 50 can be improved.

The connector 75 has a bridge configuration, which shortens a distance TR between the connector 75 and the surface of the resin member 80. Thereby, the connector 75 also promotes the heat dissipation of the first and second switching elements 10 and 20 via the portion that extends along the surface of the resin member 80; and thus, the semiconductor device 3 is provided with the increased reliability.

Figure 8A:
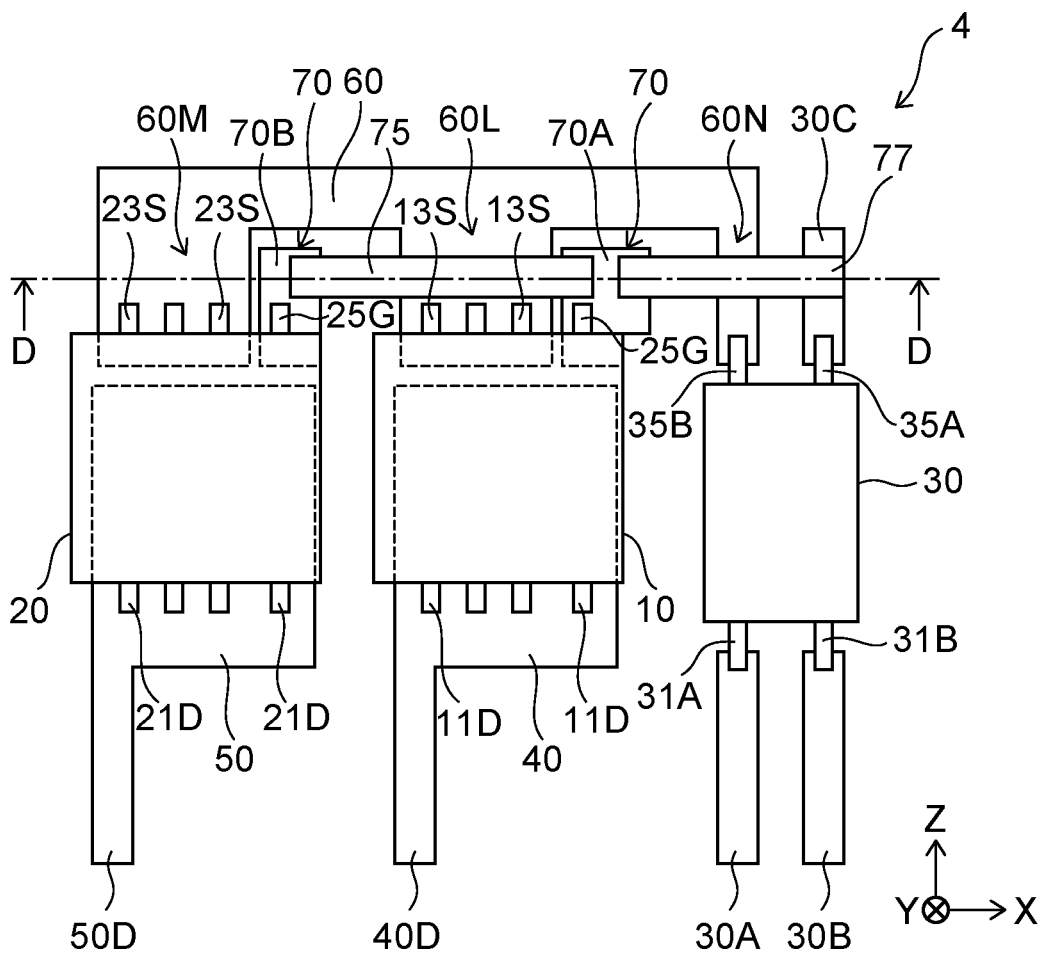
FIGS. 8A and 8B are schematic views showing a semiconductor device according to yet another modification of the embodiment.
Figure 8B:
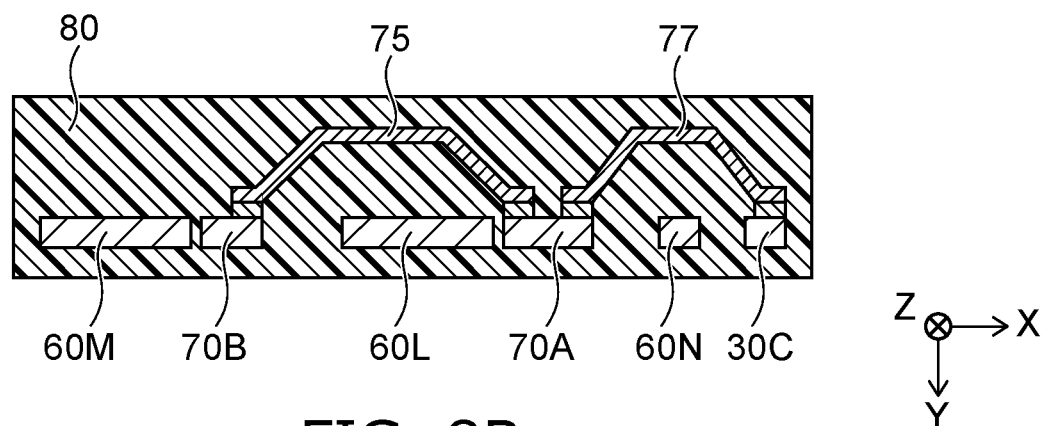

FIGS. 8A and 8B are schematic views showing a semiconductor device 4 according to yet another modification of the embodiment. FIG. 8A is a plan view showing the connection layout of the leads and the terminals of the semiconductor device 4. FIG. 8B is a cross-sectional view along line D-D shown in FIG. 8A.

As shown in FIG. 8A, the control lead 70 includes the first portion 70A and the second portion 70B. The first portion 70A is separated from the second portion 70B. Also, the first portion 70A is provided between the bonding portion 60L and the bonding portion 60N of the lead 60. The second portion 70B is provided between the bonding portion 60L and the bonding portion 60M of the lead 60. The control terminal 16G of the first switching element 10 is connected to the first portion 70A; and the control terminal 26G of the second switching element 20 is connected to the second portion 70B.

In the example, the output terminal 35A of the optical coupling element 30 is connected to an output lead 30C. The output terminal 35B of the optical coupling element 30 is connected to the bonding portion 60N of the lead 60. For example, the bonding portion 60N of the lead 60 is positioned between the output lead 30C and the first portion 70A of the control lead 70.

As shown in FIG. 8B, the first and second portions 70A and 70B of the control lead 70 are electrically connected via the connector 75. The output lead 30C and the first portion 70A are electrically connected via a connector 77. The connector 77 straddles the bonding portion 60N of the lead 60 and is connected to the output lead 30C and the first portion 70A. The connector 77 is, for example, a metal plate that includes copper and has a bridge configuration.

In the example as well, the heat dissipation of the first and second switching elements 10 and 20 can be improved by increasing the surface area of the lead 40 extending under the first switching element 10 and the surface area of the lead 50 extending under the second switching element 20. The heat dissipation can be further improved by providing the connectors 75 and 77.

Figure 9:
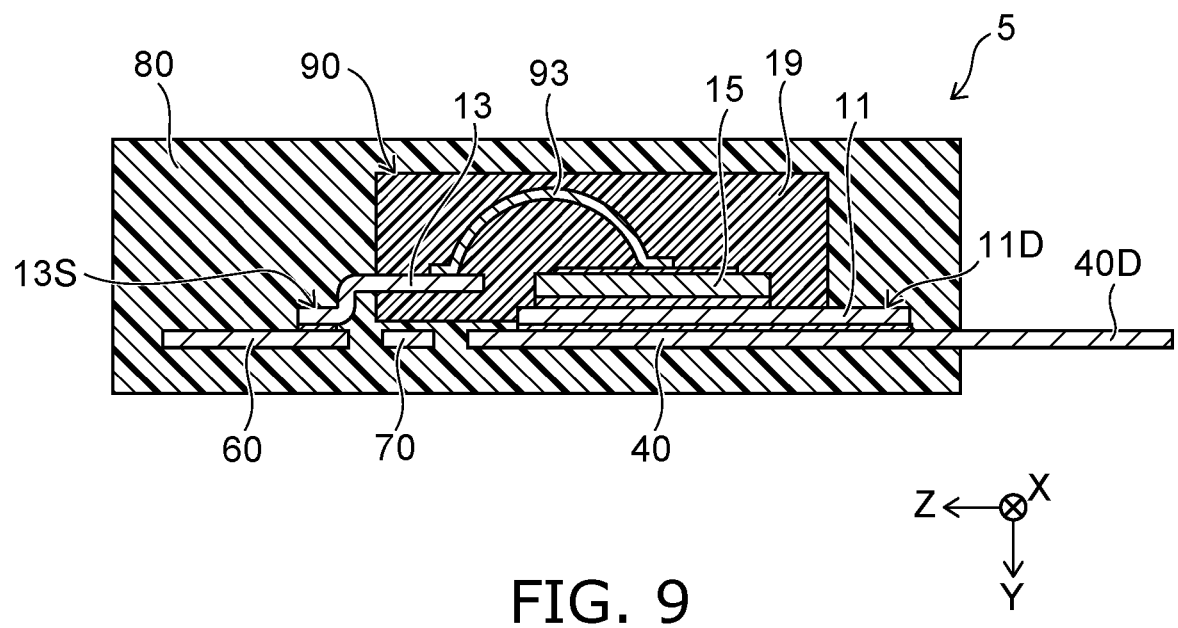
FIG. 9 is a schematic cross-sectional view showing a semiconductor device according to other modification of the embodiment.

FIG. 9 is a schematic cross-sectional view showing a semiconductor device 5 according to other modification of the embodiment. FIG. 9 is a cross-sectional view along line A-A shown in FIG. 1B.

In the example shown in FIG. 9, a switching element 90 is provided instead of the first switching element 10. The switching element 90 has a structure in which the back surface of the lead 11 is not covered with the resin member 19. The semiconductor chip 15 is mounted on the front surface of the lead 11, that is, on the front surface of the mount base 11M (referring to FIG. 3A) and is sealed with the resin member 19. For example, the semiconductor chip 15 is electrically connected to the lead 13 via a metal wire 93.

In the example, the switching element 90 is mounted so that the back surface of the lead 11 faces the lead 40 via, for example, a solder material. Thereby, the heat of the semiconductor chip 15 can be efficiently dissipated via the lead 11 and the lead 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, the device comprising:
   a first switching element including a first semiconductor chip, a first inner resin member, first and second terminals and a first control terminal,
      the first semiconductor chip including a first electrode, a second electrode, and a first control electrode,
      the first inner resin member sealing the first semiconductor chip,
      the first terminal being electrically connected to the first electrode, the first terminal projecting from the first inner resin member,
      the second terminal being electrically connected to the second electrode, the second terminal projecting from the first inner resin member,
      the first control terminal being electrically connected to the first control electrode, the first control terminal projecting from the first inner resin member;
   a second switching element including a second semiconductor chip, a second inner resin member, third and fourth terminals and a second control terminal,
      the second semiconductor chip including a third electrode, a fourth electrode, and a second control electrode,
      the second inner resin member sealing the second semiconductor chip,
      the third terminal being electrically connected to the third electrode, the third terminal projecting from the second inner resin member,
      the fourth terminal being electrically connected to the fourth electrode, the fourth terminal projecting from the second inner resin member,
      the second control terminal being electrically connected to the second control electrode, the second control terminal projecting from the second inner resin member;
   an optical coupling element including a light-emitting element, a light-receiving element, a third inner resin member, an input terminal and first and second output terminals,
      the light-receiving element being arranged to receive a light emission of the light-emitting element, the third inner resin member sealing the light-emitting element and the light-receiving element, the input terminal being electrically connected to the light-emitting element, the input terminal projecting from the third inner resin member, and the first and second output terminals being electrically connected to the light-receiving element, the first and second output terminals projecting from the third inner resin member;

a plurality of leads electrically connected to the first to fourth terminals, the first and second control terminals, the input terminal, and the first and second output terminals; and an outer resin member sealing the first and second switching elements, the optical coupling element, and the plurality of leads.

2. The device according to claim 1, wherein
the plurality of leads includes first to third leads, a control lead and an input lead,
the first lead being electrically connected to the first terminal,
the second lead being electrically connected to the third terminal,
the third lead being electrically connected to the second terminal, the fourth terminal, and the first output terminal,
the control lead being electrically connected to the first control terminal, the second control terminal, and the second output terminal,
the input lead being electrically connected to the input terminal; and
the first lead, the second lead and the input lead each include portions projecting from the outer resin member.

3. The device according to claim 2, wherein
the first switching element, the second switching element, and the optical coupling element are arranged in a first direction;
the first switching element is provided between the second switching element and the optical coupling element;
the first terminal, the third terminal, and the input terminal project from the first to third inner resin members in a second direction crossing the first direction; and
the second terminal, the fourth terminal, the first control terminal, the second control terminal, and the first and second output terminals project from the first to third inner resin members in a direction opposite to the second direction.

4. The device according to claim 3, wherein
the first lead, the second lead, and the input lead project from the outer resin member in the second direction.

5. The device according to claim 3, wherein
the control lead extends between the first lead and the third lead and between the second lead and the third lead.

6. The device according to claim 1, further comprising:
a first connector electrically connecting the first and second control terminals, the first connector being sealed in the outer resin member,
the plurality of leads including first to third leads, first and second control lead, and an input lead,
the first lead being electrically connected to the first terminal,
the second lead being electrically connected to the third terminal,
the third lead being electrically connected to the second terminal, the fourth terminal, and the first output terminal,
the first control lead being electrically connected to the first control terminal,
the second control lead being electrically connected to the second control terminal,
the input lead being electrically connected to the input terminal,
the first connector being electrically connecting the first and second control leads.

7. The device according to claim 6, wherein
the first control lead is connected to the second output terminal.

8. The device according to claim 6, further comprising:
a second connector electrically connecting the first control terminal and the second output terminal, the second connector being sealed in the outer resin member,
the plurality of leads further including an output lead electrically connected to the second output terminal,
the second connector electrically connecting the first control lead and the output lead.

9. A method for manufacturing a semiconductor device, the method comprising:
mounting a first switching element on a leadframe,
the first switching element including a first semiconductor chip, first and second terminals, a first control terminal and a first resin member,
the first semiconductor chip including first and second electrodes and a first control electrode, the first terminal being electrically connected to the first electrode, the second terminal being electrically connected to the second electrode, the first control terminal being electrically connected to the first control electrode,
the first resin member sealing the first semiconductor chip, the first and second terminals and the first control terminal projecting from the first resin member,
the leadframe including a frame, first to third leads and a control lead, the first to third leads being linked to the frame via first suspension pins, the control lead being linked to the third lead via a second suspension pin,
the first switching element being mounted on the leadframe by connecting a first terminal to the first lead, connecting a second terminal to the third lead, and connecting a first control terminal to the control lead;
mounting a second switching element on the leadframe,
the second switching element including a second semiconductor chip, third and fourth terminals, a second control terminal and a second resin member,
the second semiconductor chip including third and fourth electrodes and a second control electrode, the third terminal being electrically connected to the third electrode, the fourth terminal being electrically connected to the fourth electrode, the second control terminal being electrically connected to the second control electrode,
the second resin member sealing the second semiconductor chip, the third and fourth terminals and the second control terminal projecting from the second resin member,
the second switching element being mounted on the leadframe by connecting the third terminal to the second lead, connecting the fourth terminal to the third lead, and connecting the second control terminal to the control lead;

cutting the second suspension pin that links the control lead and the third lead after the mounting of the first and second switching elements on the leadframe; and molding an outer resin member that seals the first switching element, the second switching element, the first to third leads and the control lead after the cutting of the second suspension pin that links the control lead and the third lead.

10. The method according to claim 9, further comprising:

cutting the first suspension pin that links the frame and the third lead simultaneously with the second suspension pin that links the control lead and the third lead; and cutting other first suspension pins that links the frame and the first and second leads after the molding of the outer resin member.

11. The method according to claim 9, further comprising:

mounting an optical coupling element on the leadframe, the optical coupling element including a light-emitting element, a light-receiving element, input and output terminals and a third resin member, the light-receiving element being arranged to receive a light emission of the light-emitting element, the third resin member sealing the light-emitting element and the light-receiving element, the input terminal being electrically connected to the light-emitting element, the output terminal electrically connecting the light-receiving element and the third lead.

12. A semiconductor device, comprising:

a first switching element including a first terminal, a second terminal, and a first control terminal controlling a current flowing between the first terminal and the second terminal;

a second switching element including a third terminal, a fourth terminal, and a second control terminal controlling a current flowing between the third terminal and the fourth terminal;

an optical coupling element including a light-emitting element, a light-receiving element receiving a light emission of the light-emitting element, an input terminal electrically connected to the light-emitting element, and an output terminal outputting an output signal of the light-receiving element when the light-receiving element receives an optical signal output from the light-emitting element;

a first lead connected to the first terminal;

a second lead connected to the third terminal;

a third lead connected to the input terminal of the optical coupling element;

a fourth lead connected to the second and fourth terminals;

a fifth lead connected to the first control terminal, the second control terminal, and the output terminal of the optical coupling element; and a resin member that covers the first switching element, the second switching element, the optical coupling element, and the first to fifth leads so that the fourth and fifth leads are not exposed, and at least portions of the first to third leads project outside the resin member.

13. The device according to claim 12, wherein the first to third leads project from the resin member in a same direction.

14. The device according to claim 13, wherein the first switching element, the second switching element, and the optical coupling element are arranged in a first direction, and the first to third leads project in a second direction crossing the first direction.

15. The device according to claim 14, wherein the resin member includes first and second major surfaces and a first side surface, the first and second major surfaces being parallel to a plane including the first and second directions, the first side surface linking the first and second major surfaces;

the first and second switching elements and the optical coupling element are provided between the first major surface and the second major surface; and the first to third leads project from the first side surface.

* * * * *